United States Patent
Tatt et al.

(10) Patent No.: US 7,312,525 B2
(45) Date of Patent: Dec. 25, 2007

(54) THERMALLY ENHANCED PACKAGE FOR AN INTEGRATED CIRCUIT

(75) Inventors: Koay Hean Tatt, Penang (MY); Tan Gin Ghee, Penang (MY)

(73) Assignee: Avago Technologies General IP (Singapore) Pte Ltd

(*) Notice: Subject to any disclaimer, the term of this patent is extended or adjusted under 35 U.S.C. 154(b) by 0 days.

(21) Appl. No.: 11/345,104

(22) Filed: Jan. 31, 2006

(65) Prior Publication Data
US 2006/0125089 A1 Jun. 15, 2006

Related U.S. Application Data

(63) Continuation of application No. 10/327,465, filed on Dec. 19, 2002, now abandoned.

(51) Int. Cl.
*H01L 23/12* (2006.01)
*H05K 7/20* (2006.01)

(52) U.S. Cl. .............. 257/704; 257/707; 257/713; 257/717; 257/720; 257/E23.101; 361/704; 361/709; 361/712

(58) Field of Classification Search .............. None
See application file for complete search history.

(56) References Cited

U.S. PATENT DOCUMENTS

| | | | |
|---|---|---|---|
| 5,293,301 A * | 3/1994 | Tanaka et al. ............ 361/707 |
| 5,600,179 A | 2/1997 | Suzuki | |
| 5,834,839 A * | 11/1998 | Mertol ............ 257/704 |
| 6,011,304 A * | 1/2000 | Mertol ............ 257/706 |
| 6,206,997 B1 | 3/2001 | Egitto et al. | |
| 6,282,094 B1 | 8/2001 | Lo et al. | |
| 6,521,990 B2 * | 2/2003 | Roh et al. .......... 257/706 |
| 6,528,882 B2 * | 3/2003 | Ding et al. ......... 257/738 |
| 6,552,428 B1 * | 4/2003 | Huang et al. ....... 257/706 |
| 6,707,168 B1 * | 3/2004 | Hoffman et al. ..... 257/796 |
| 6,882,041 B1 * | 4/2005 | Cheah et al. ....... 257/704 |

* cited by examiner

*Primary Examiner*—Alonzo Chambliss

(57) ABSTRACT

A circuit assembly having an insulating base, a heat-conducting plate and a circuit containing die is disclosed. The die is in thermal contact with the heat-conducting plate, which is bonded to the insulating base. The insulating base includes heat-conducting channels that are in thermal contact with the heat-conducting plate. The die includes an integrated circuit therein and is mounted such that the heat-conducting plate is disposed between the die and the insulating plate. The insulating base preferably includes signal conducting channels for providing electrical connections to the die, the heat-conducting plate having an opening therein for making the connections between the die and the conducting channels. The assembly may also include a heat-spreading cover in thermal contact with the heat-conducting base plate, the heat-spreading cover overlying the die. The heat-conducting channels are preferably filled with solder, and include a solder protrusion extending from the heat-conducting channels.

5 Claims, 2 Drawing Sheets

THERMALLY ENHANCED PACKAGE FOR AN INTEGRATED CIRCUIT

CROSS REFERENCE TO RELATED APPLICATION

This application is a continuation of application Ser. No. 10/327,465 filed on Dec. 19, 2002 now abandoned; the entire disclosure of which is incorporated into this application by reference.

FIELD OF THE INVENTION

The present invention relates to packages for integrated circuits and the like.

BACKGROUND OF THE INVENTION

Semiconductor chips are typically sealed in a package that is soldered to a printed circuit board. The various connections between the electrical components on the chip and the conductors on the printed circuit board are made through conductors that pass through the package and are connected to the printed circuit board by solder. Within the package, the chip is encapsulated in a potting compound that protects the chip from damage caused by exposure to moisture and oxygen.

Early chip designs contained relatively few active components operating at relatively slow speeds, and hence, heat dissipation was not a major problem. However, as chip speeds and component densities have increased, heat dissipation has become a major problem. One prior art method for increasing the heat dissipation in a semiconductor package utilizes a heat-conducting cover. In this design, the cover is placed over the encapsulated chip to improve the heat conduction from the chip to the air above the chip. Unfortunately, this approach is of limited value since the heat dissipating cover depends on the conduction of the heat from the chip through the encapsulating material, which is a poor heat conductor. In addition, the surface area of the cover is limited to the size of the semiconductor package, and hence, the amount of heat that can be dissipated by the cover is limited.

SUMMARY OF THE INVENTION

The present invention is a circuit assembly having an insulating base, a heat-conducting plate and a circuit-containing die. The die is in thermal contact with the heat-conducting plate, which is bonded to the insulating base. The insulating base includes heat-conducting channels that are in thermal contact with the heat-conducting plate. The die includes an integrated circuit therein and is mounted such that the heat-conducting plate is disposed between the die and the insulating plate. The insulating base preferably includes signal conducting channels for providing electrical connections to the die, the heat-conducting plate having an opening therein for making the connections between the die and the conducting channels. The assembly may also include a heat-spreading cover in thermal contact with the heat-conducting base plate, the heat-spreading cover overlying the die. The heat-conducting channels are preferably filled with solder, and include a solder protrusion extending from the heat-conducting channels to facilitate attachment to a printed circuit board.

DETAILED DESCRIPTION OF THE PREFERRED EMBODIMENTS OF THE INVENTION

Figure 1:
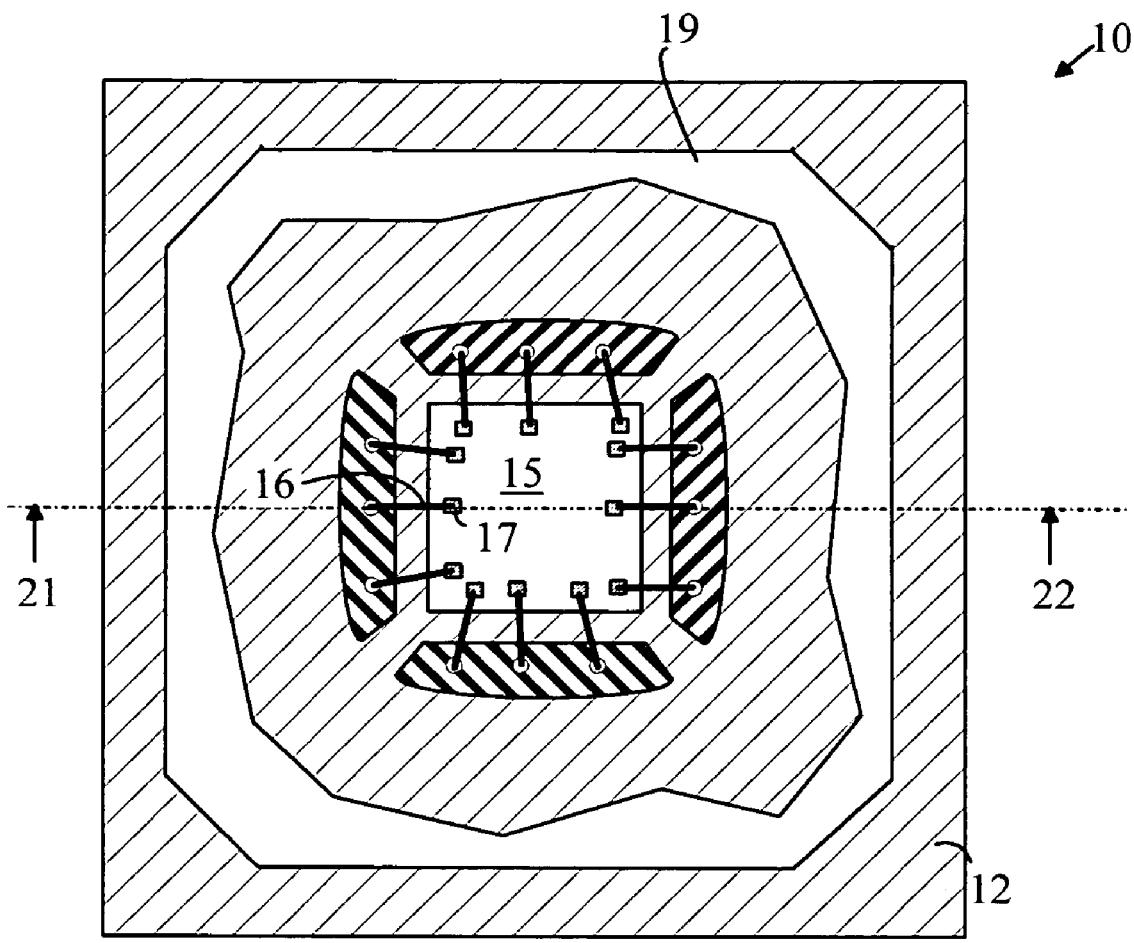
FIG. 1 is a top view of a semiconductor package according to one embodiment of the present invention.
Figure 2:
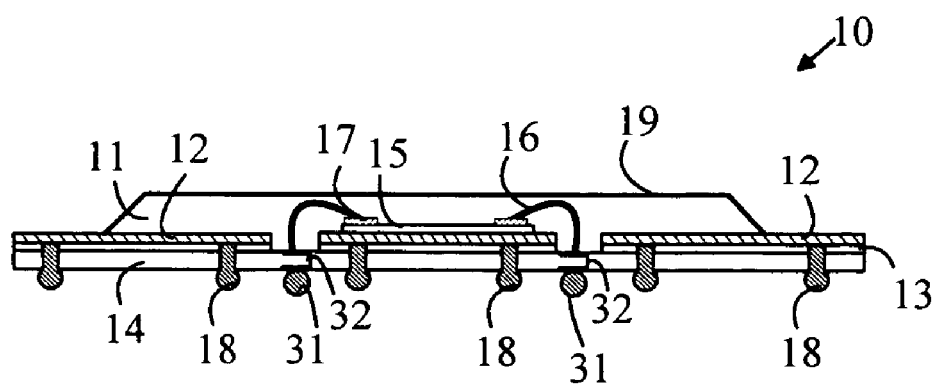
FIG. 2 is a cross-sectional view of package 10 through line 21-22.

The manner in which the present invention provides its advantages can be more easily understood with reference to FIGS. 1 and 2. FIG. 1 is a top view of semiconductor package 10 with a portion of the top heat-conducting plate cut away. FIG. 2 is a cross-sectional view of package 10 through line 21-22. Semiconductor package 10 includes a semiconductor chip 15 that is mounted on a heat-conducting plate 12. Plate 12 is preferably constructed from copper. Heat-conducting plate 12 is bonded to a substrate 14 by a layer of adhesive 13. Substrate 14 has a number of holes running therethrough. Some of these holes are utilized for making connections to the ground plane of a printed circuit board on which package 10 is to be mounted. These connections are made by solder balls that are heated when the package is mounted to the printed circuit board. Exemplary holes of this type together with the solder balls are shown at 18.

Signal connections between chip 15 and the printed circuit board are made through copper plated holes in substrate 14 that connect the pads on the top and bottom surface of substrate 14. Exemplary signal conducting paths are shown at 32 connected to the corresponding solder balls that are shown at 31. The pads 17 on chip 15 and the corresponding signal paths 32 on substrate 14 are connected via conventional wire bonding techniques. Exemplary wire bonds are shown at 16.

A heat-conducting top plate 19 may also be incorporated in the package to further dissipate heat generated by chip 15. If such a plate is included, it is preferably connected to heat-conducting plate 12 at the periphery of heat-conducting plate 12 and forms a "roof" over chip 15. However, embodiments lacking top plate 19 can be advantageously utilized. The space 11 between top plate 19 and chip 15 is filled with a conventional encapsulating compound to protect chip 15 from damage. If top plate 19 is omitted, this encapsulating layer is still utilized to protect the chip. An additional layer of molding compound can be included around the periphery of top plate 19; however, to simplify the drawing, this additional layer of molding compound has been omitted from the drawings.

The present invention can dissipate substantially more heat than prior art packages because the heat-conducting plate is more efficient in removing the heat from chip 15 and because the heat so removed is channeled to a larger heat dissipating surface. Heat-conducting plate 12 has a higher thermal conductivity then the conventional packaging material on which the chip is normally mounted in prior art devices. In addition, heat-conducting plate 12 is thermally connected to the ground plane on the printed circuit board via the heat-conducting plugs shown at 18. These heat-conducting plugs are preferably constructed from solder that "wets" the copper from which plate 12 is constructed. Hence, heat collected by heat-conducting plate 12 is effectively channeled to the ground plane of the printed circuit on which package 10 is mounted. Since the ground plane of the circuit board has considerably more surface area exposed to the air than chip 15 or top 19, heat can be more effectively transferred to the air above the ground plane provided the heat-conducting plugs have sufficient combined cross-sectional area to assure that the plugs do not inhibit the flow of heat to the ground plane. To optimize the heat transfer area, the heat-conducting plate is slightly smaller than substrate 14. In the preferred embodiment of the invention, the heat-conducting plate has dimensions that are 0.5 mm smaller than substrate 14.

In addition, heat from the heat-conducting plate is routed directly to top plate 19, which also has a surface area that is substantially larger than chip 15. It should be noted that the present invention, unlike prior art schemes, does not depend on the heat from the chip traversing the encapsulating compound above the chip, and hence, the thermal "bottleneck" that hampers prior art designs is substantially reduced in the present invention. In the preferred embodiment of the invention, the heat conducting channels are between 0.5 mm and 0.65 mm to assure that these channels do not limit the heat flow from the chip to the ground plane of the printed circuit board. However, the sizes and numbers of heat-conducting channels can be adjusted to match the heat output of the chip.

Figure 3:
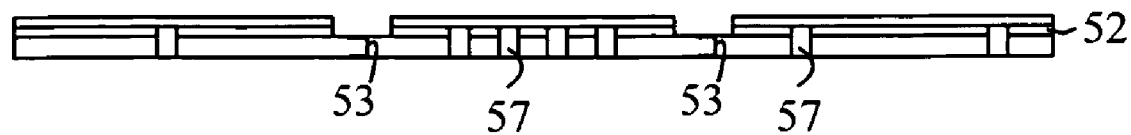
FIGS. 3-5 are cross-sectional views of the packaged chip at various stages in the packaging process.
Figure 4:
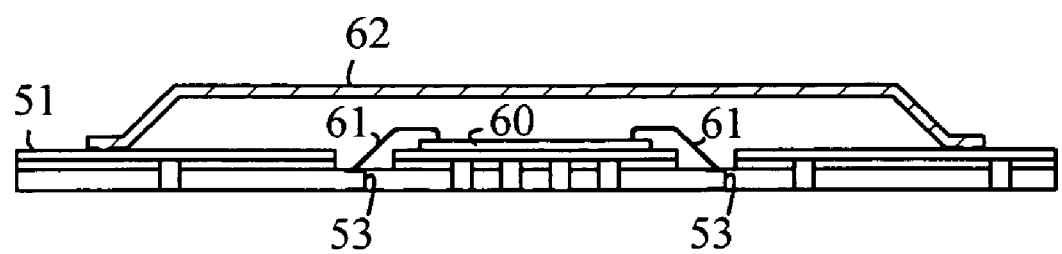
Figure 5:
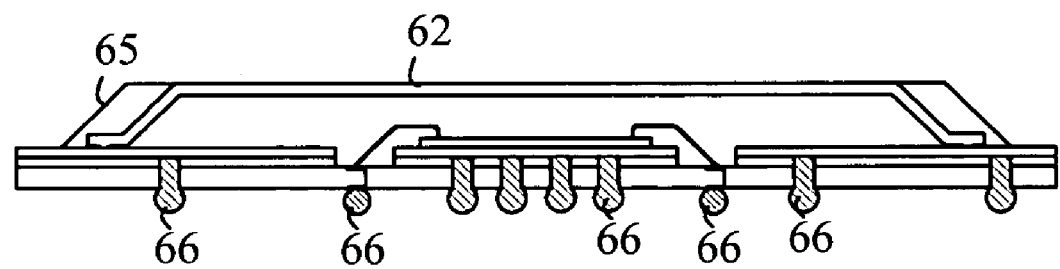

The manner in which the semiconductor chip is packaged using the present invention may be more easily understood with reference to FIGS. 3-5, which are cross-sectional views of the packaged chip at various stages in the packaging process. Referring to FIG. 3, in the preferred embodiment of the present invention, the packaging process starts with a part in which the heat-spreading plate 51 is already attached to a substrate by an adhesive layer 52. It is assumed that vias 57 have been drilled through the substrate to the heat-spreading plate.

Chip 60 is then attached to heat spreader 51 and the wire bonds 61 between chip 60 and the signal pins 53 in the substrate are formed using a conventional wire bonding system. If the optional top heat dissipating plate 62 is to be used, it is attached to heat-spreading plate 51 leaving the package as shown in FIG. 4.

A conventional molding process is then used to encapsulate all of the components in an encapsulating layer 65. The vias 57 are then filled with small solder balls using a conventional drop in process and the substrate is then heated to melt the solder balls leaving the drilled holes filled with solder. Finally, solder balls 66 are attached to the various vias and copper pads leaving the package as shown in FIG. 5. It is assumed that the above-described operations are performed on a strip of packages, not just the one shown in the figures. In the final step, the individual packages are separated using a conventional singulation process.

In the above-described embodiments of the present invention, the heat from the chip is conducted away from the chip both by utilizing the optional heat dissipating plate and the conducting paths to the ground plane of the underlying printed circuit board. While the paths through the substrate to the ground plane can provide substantially more heat conducting capacity than the top heat dissipating plate 62, the combination of the heat conducting plate under the chip and the top heat dissipating plate still provides substantially better heat conduction than prior art methods. Accordingly, if the top heat-conducting plate is used, the heat conducting vias may be omitted in cases in which the heat generated by the chip is less intense.

Various modifications to the present invention will become apparent to those skilled in the art from the foregoing description and accompanying drawings. Accordingly, the present invention is to be limited solely by the scope of the following claims.

What is claimed is:

1. A circuit assembly comprising:
   a heat-conducting base plate;
   an insulating base;
   a die having an integrated circuit therein, said die being in thermal contact with said heat-conducting base plate, said heat-conducting base plate being disposed between said die and said insulating base;
   a heat-spreading cover overlying said die and connected to said heat-conducting base plate, said heat-spreading cover defining a wall of a cavity over said die, said cavity surrounding the portions of said die that are not in thermal contact with said heat-conducting base plate, wherein said cavity is filled with a molding compound, said molding compound and said heat-conducting base plate encapsulating said die, and wherein said heat-spreading cover is connected to said heat conducting base plate in a region devoid of said molding compound;
   wherein said insulating base further comprises a plurality of heat-conducting channels, said heat-conducting channels being in thermal contact with said heat-conducting base plate; and wherein said insulating base further comprises signal conducting channels for providing electrical connections to said die said heat-conducting base plate having an opening therein for making said connections between said die and said signal conducting channels.

2. The circuit assembly of claim 1 wherein said heat-conducting channels comprise solder.

3. The circuit assembly of claim 1 further comprising a solder protrusion extending from said heat-conducting channels.

4. The circuit assembly of claim 1 wherein said heat-conducting base plate comprises copper.

5. The circuit assembly of claim 1 wherein said heat-conducting plate is bonded to said insulating base.

* * * * *